United States Patent [19]

Scott, III

[11] Patent Number: 5,117,200

[45] Date of Patent: May 26, 1992

[54] COMPENSATION FOR A FEEDBACK AMPLIFIER WITH CURRENT OUTPUT STAGE

[75] Inventor: Baker P. L. Scott, III, Austin, Tex.

[73] Assignee: Crystal Semiconductor Corporation, Austin, Tex.

[21] Appl. No.: 621,475

[22] Filed: Dec. 3, 1990

[51] Int. Cl.⁵ .............................................. H03F 1/34
[52] U.S. Cl. .................................... 330/253; 330/85; 330/260; 330/294
[58] Field of Search ................ 330/85, 253, 260, 294

[56] References Cited

U.S. PATENT DOCUMENTS 4,213,098  7/1980  Tsividis .............................. 330/253
4,371,843  2/1983  Fang et al. ......................... 330/253
4,774,478  9/1988  Taylor ................................. 330/294

Primary Examiner—James B. Mullins
Attorney, Agent, or Firm—Leonard & Lott

[57] ABSTRACT

A wide bandwidth transconductance amplifier utilizing internal feedback is stabilized over a wide range of output currents. A compensation driver circuit senses the output current in the amplifier and feeds it back through a compensation capacitor. This keeps the bandwidth of the amplifier constant and optimally stabilized over a 16 to 1 range in output current. This compensation scheme eliminates compensation compromises that can limit the useful dynamic range of transconductnce amplifiers while offering a wide bandwidth low distortion transconductance with high output impedance over frequency.

19 Claims, 3 Drawing Sheets

COMPENSATION FOR A FEEDBACK AMPLIFIER WITH CURRENT OUTPUT STAGE

REFERENCE TO RELATED APPLICATION

Reference is made to a related application entitled SLEW RATE ENHANCED LINEAR AMPLIFIER. Ser. No. 07/621,471, filed Dec. 3, 1990 in the name of Scott, Baker P., III, and which is hereby incorporated by reference. This application describes and claims distortion reduction techniques, one of which is used in the preferred embodiment of the present invention.

TECHNICAL FIELD

The present invention pertains to feedback amplifiers with current output stages, and more particularly, to compensation circuitry for feedback amplifiers with current output stages.

BACKGROUND OF THE INVENTION

There are many applications for high speed low distortion feedback amplifiers with current output stages. One such application is a transconductance amplifier used in an Ethernet interface chip for tapping into a coaxial cable in an Ethernet system. The interface chip receives a digital signal and converts it to a current in the coax cable. Because of the Ethernet electrical specifications relating to rise time and fall time, frequency components in excess of 10 MHz must be amplified and converted with low distortion to an output current having a range of 0 to 90 milliamps.

Many transconductance amplifiers, while able to pass high frequencies, have stability compromises due to the changes in transconductance (gm) or gain in the output or feedback transistors as a function of the current levels through these transistors. Since the typical Ethernet interface requires variations in output currents of approximately 16 to 1, which results in approximately a four to one change in transconductance in a MOS transistor or a 16 to 1 change in a bipolar transistor, robust compensation techniques are required to provide stability in the interface circuit.

Miller compensation is traditionally used to improve the stability of voltage amplifiers. Miller compensation provides for an amplifier bandwidth that is independent of output transistor transconductance. Unfortunately, Miller-compensated amplifiers normally have low output impedance at frequencies approaching the unity gain frequency of the amplifier. The Ethernet application demands a current output amplifier with high output impedance.

Therefore, it can be appreciated that a transconductance amplifier with compensation circuitry to provide stable operation of the amplifier at high frequencies and over a wide range of operating currents is highly desirable.

SUMMARY OF THE INVENTION

It is, therefore, an object of this invention to provide a high speed transconductance feedback amplifier with compensation circuitry to provide stable amplification at high frequencies and over a wide range of operating currents.

Shown in an illustrated embodiment of the invention is an amplifier having an input circuit coupled to an input terminal for receiving an input signal and providing an intermediate signal. An output stage is coupled to the intermediate signal and provides an output current from the amplifier. A compensation admittance circuit which includes a compensation capacitor, also referred to herein as a compensation capacitor, has a first terminal coupled to a first node in the input circuit which signal at the node varies in response to the input signal. An admittance driver circuit, also referred to herein as a compensation driver circuit, has an output coupled to a second terminal of the compensation capacitor and has an input coupled to a node in the amplifier such that the second terminal receives a time varying signal which has certain predetermined characteristics which change in the same manner as the corresponding characteristics in the output current.

In a further aspect of the illustrated embodiment the compensation capacitor and the compensation driver circuit provide bandwidth compensation to the amplifier, and the certain predetermined characteristics affect the bandwidth of the amplifier.

In yet a further aspect of the illustrated embodiment the compensation driver circuit has characteristics which vary approximately proportionally to the gm of the feedback transistor in the amplifier.

BRIEF DESCRIPTION OF THE DRAWINGS

The aforementioned and other features, characteristics, advantages, and the invention in general, will be better understood from the following, more detailed description taken in conjunction with the accompanying drawings, in which.

Figure 1:
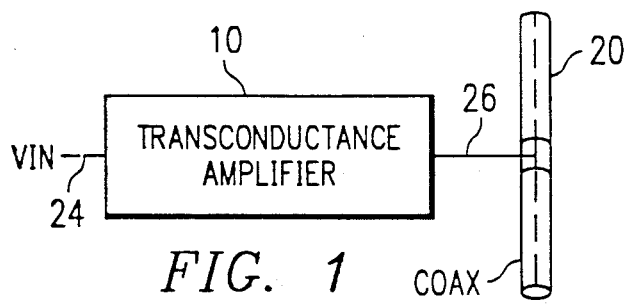
FIG. 1 is a block diagram of the output amplifier of an Ethernet interface circuit having a high speed transconductance amplifier according to the present invention.

It will be appreciated that for purposes of clarity and where deemed appropriate, reference numerals have been repeated in the figures to indicate corresponding features.

DETAILED DESCRIPTION

A transconductance amplifier according to the preferred embodiment of the present invention includes a first differential amplifier having a positive and a negative input. The negative input is connected to the input signal to the amplifier. The output of the first differential amplifier is connected to the input of a buffer circuit and also to one end of a compensation capacitor. The output of the buffer circuit is connected to the gates of three n-channel transistors, the sources of which are connected together and to a negative supply voltage. The drain of the first transistor is connected to the positive input of the first differential amplifier and to one end of a resistor, the other end of which is connected to ground. The drain of the second MOS transistor is connected to the positive input of a second differential amplifier and also to one end of a second resistor, the other end of which is connected to ground. The drain of the third transistor forms the current output terminal of the amplifier. The second differential amplifier has its negative input connected to the input voltage and its output connected to the other end of the compensation capacitor.

In operation, the input signal is coupled through the first differential amplifier. The output from the first differential amplifier is fed through the buffer circuit and to the first transistor. The drain of the first transistor is fed back to the positive input of the first differential amplifier so that the current flow through the first resistor is proportional to the input voltage. The current in the third transistor is an appropriate multiple of the current in the first transistor, the multiple determined by the relative channel widths of the ratioed transistors. During operation of the amplifier the transconductance of the first transistor varies as the square root of the drain current through the first transistor and this change in transconductance changes the bandwidth of the amplifier. Since the current through the first transistor in the application for which this amplifier was designed changes in a ratio of 16 to 1, the transconductance, gm, and therefore the uncompensated bandwidth, changes on the order of 4 to 1.

In order for the amplifier to remain stable and to have a constant bandwidth over the full signal range of the amplifier, the compensating capacitor is coupled to the output of the first differential amplifier. The output of the first differential amplifier is a node at which the capacitive loading affects the bandwidth of the amplifier. In one embodiment of the invention the compensating capacitor is connected directly between the output of the first differential amplifier and the drain of the second transistor. However in the preferred embodiment of the invention the compensating capacitor is connected between the output of the first differential amplifier and the output of the second differential amplifier. In both cases a node internal to the amplifier is created that has characteristics proportional to the output, and therefore the feedback transconductance, gm. This node is then used for Miller feedback compensation instead of an output node as is used in voltage amplifiers.

In either embodiment, whether the compensating capacitor is connected to the drain of the second transistor or to the output of the second differential amplifier, the effective capacitance of the compensating capacitor varies as a function of the gm of the second transistor. Since the second transistor and first transistors are fabricated with corresponding characteristics, this variation in gm of the second transistor effectively matches the variation in gm of the first transistor. Therefore the variation caused in the bandwidth of the overall amplifier due to the variations in gm of the first transistor is compensated for by the variations in the effective capacitance of the compensation capacitor. In this manner, the bandwidth of the overall amplifier is approximately constant over the output current range, and the amplifier is stable over this entire range.

Turning to the drawings, FIG. 1 is a block diagram of the output amplifier of an Ethernet interface circuit which includes a transconductance amplifier 10 and an Ethernet coax cable 20. An input voltage signal VIN appears on line 24 as an input to the transconductance amplifier 10. The transconductance amplifier 10 receives the input voltage waveform on line 24 and provides a proportional current to the coaxial cable at terminal 26. As stated in the BACKGROUND OF THE INVENTION section above, the interface circuit is used to tap into a coax cable. The output current on line 26 must operate into an effective impedance of 25 ohms and must be able to output a current signal which varies between approximately 4.8 milliamps and 77 milliamps.

Figure 2:
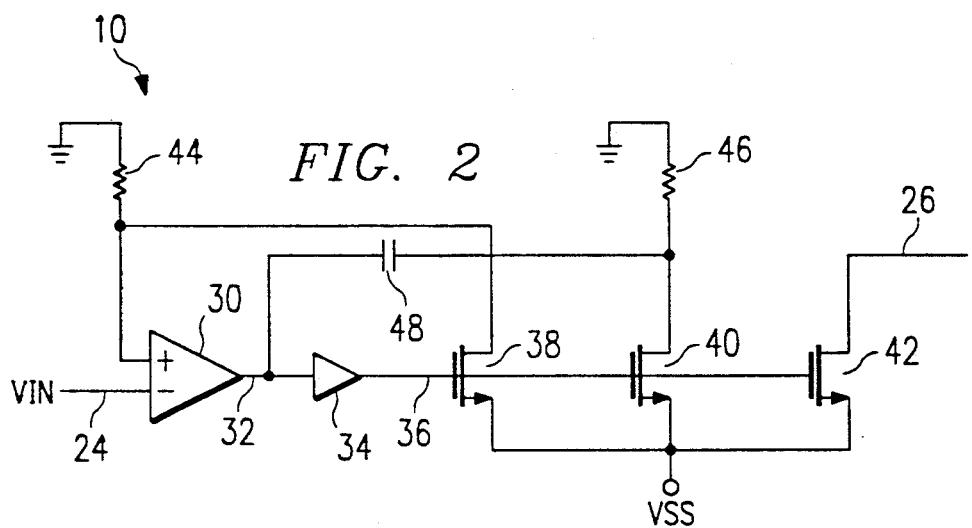
FIG. 2 is a high speed transconductance amplifier according to the present invention.

Shown in FIG. 2 is a first embodiment, but not the preferred embodiment, of the transconductance amplifier 10. The amplifier 10 receives the input voltage VIN on line 24 at the negative input of a first differential amplifier 30, the output of which is coupled to a node 32 which in turn is coupled to the input of a buffer amplifier 34. The output of the buffer amplifier 34 is connected to a node 36 which is also connected to the gate of a first n-channel transistor 38, to the gate of a second n-channel transistor 40, and to the gate of a third n-channel transistor 42. The signal on node 36 can be regarded as an intermediate signal of the amplifier 10. The sources of the transistors 38, 40, and 42 are connected together and to a first reference potential which is a negative supply voltage of minus 9 volts in the preferred embodiment. The drain of the first transistor 38 is connected to one end of a resistor 44, the other end of which is connected to a second reference potential which is ground in the first embodiment. The drain of transistor 38 is also connected to the positive input of the differential amplifier 30. The drain of the transistor 40 is connected to one end of a resistor 46 the other end of which is connected to ground. The drain of the transistor 40 is also connected to one end of the compensation capacitor 48 the other end of which is connected to the node 32. The compensation capacitor 48 comprises a compensation admittance circuit coupled between the drain of the transistor 40 and the node 32. The transistor 40 and resistor 46 form an admittance or capacitor driver circuit in FIG. 2. The drain of the transistor 42 forms the output terminal 26 of the amplifier 10.

In operation the input voltage VIN on line 24 is compared to the voltage at the drain of the transistor 38 in the differential amplifier 30. By the operation of the feedback loop which includes the differential amplifier 30, the buffer 34, the transistor 38, and the resistor 44 the voltage level at the input terminal 24 is duplicated at the positive input of the differential amplifier 30. Thus the current through the resistor 44 multiplied by the resistance of the resistor 44 is made equal to the input voltage on line 24, and the current through the resistor 44 and the transistor 38 is proportional to the input voltage on the line 24. This current through the transistor 38 is multiplied up by the relative channel widths of the ratioed transistors 38, 40, and 42 to provide the proper level of output current at the output terminal 26 and the proper current at the drain of transistor 40. Therefore the current at the drain of the transistor 40 through the resistor 46 produces a voltage which varies linearly with the output current at the output terminal 26. The current output, from the drain of transistor 42, provides a high output impedance for the amplifier 10.

However, as the current through the transistor 38 varies, the transconductance, gm, of the transistor varies in an amount approximately proportional to the square root of the current through it. Thus if the current through the transistor 42 varies from 4.8 milliamps to 77 milliamps for a 1 to 16 ratio, then the current through the transistor 38 also varies at a ratio of 1 to 16, and therefore the gm varies at a ratio of approximately 1 to 4. Since the bandwidth of the amplifier 10 is dependent on the gm of the transistor 38, the bandwidth of the amplifier 10, if left uncompensated, would also vary at approximately the same ratio. For signal fidelity reasons the amplifier cannot simply be overcompensated for the high current case. Thus variations in the bandwidth can lead to instabilities in the operation of the feedback amplifier which, of course, must be avoided.

In order to provide compensation to limit the bandwidth at the higher levels of current through the transistor 38 and therefore to provide stability to the amplifier 10, the compensating capacitor 48 is connected between the node 32 and the drain of the transistor 40. The effective capacitance at node 32 caused by the compensating capacitor 48, the transistor 40, and the resistor 46 is proportional to the changes in the gm of transistor 38. The effective capacitance is caused by the Miller feedback effect, and is well known to those skilled in the art.

In this and the preferred embodiment, transistors 38 and 40 are similarly constructed so that the gm of transistor 40 is proportionally equal to the gm of transistor 38. Therefore since the variation in the effective compensating capacitance arising from capacitor 48, transistor 40, and resistor 46 matches the variation in the gm of transistor 38, the amplifier 10 has a bandwidth which is effectively constant over the operating range of the amplifier 10.

One skilled in the art might question the addition of transistor 40 and resistor 46 to the circuit to provide amplifier compensation because transistor 38 and 42 are already present and could be used in a Miller capacitance compensation scheme.

However, capacitive feedback from the drain of transistor 42, the current output, would reduce the output impedance of the transconductance amplifier at higher frequencies to approximately the gm of transistor 42. This is unacceptable for Ethernet circuits which require high output impedance at frequencies well in excess of 10 MHz.

Another possibility would be to feed back the compensation capacitor from the drain of transistor 38. This would give the desired output impedance but has two other problems. First, in response to a VIN step, the voltage change across the capacitor 48 is nonlinear because of the nonlinear gain or gm of transistor 38. This nonlinear voltage change causes a nonlinear ac current in the capacitor 48 that would be summed with the feedback current from transistor 38 causing distortion in the amplifier. Secondly, feedback capacitance from the drain of transistor 38 would put a right half plane zero in the frequency response of the amplifier. Right half plane zero problems can be solved by adding the correct resistance in series with capacitor 48, or both problems can be solved by adding a buffer circuit between the node formed at the drain of transistor 38 and the compensation capacitor 48. However, the circuit complexity of a buffer is at least as great as adding transistor 40 and resistor 44 and the flexibility of having a different voltage gain for transistor 38 and 40 is lost. The remaining drawback with the embodiment of FIG. 2 is that the compensation capacitor 48 must be charged and discharged as the output signal changes. This can cause large signal distortion in the amplifier that can be eliminated with embodiment of FIG. 3.

Figure 3:
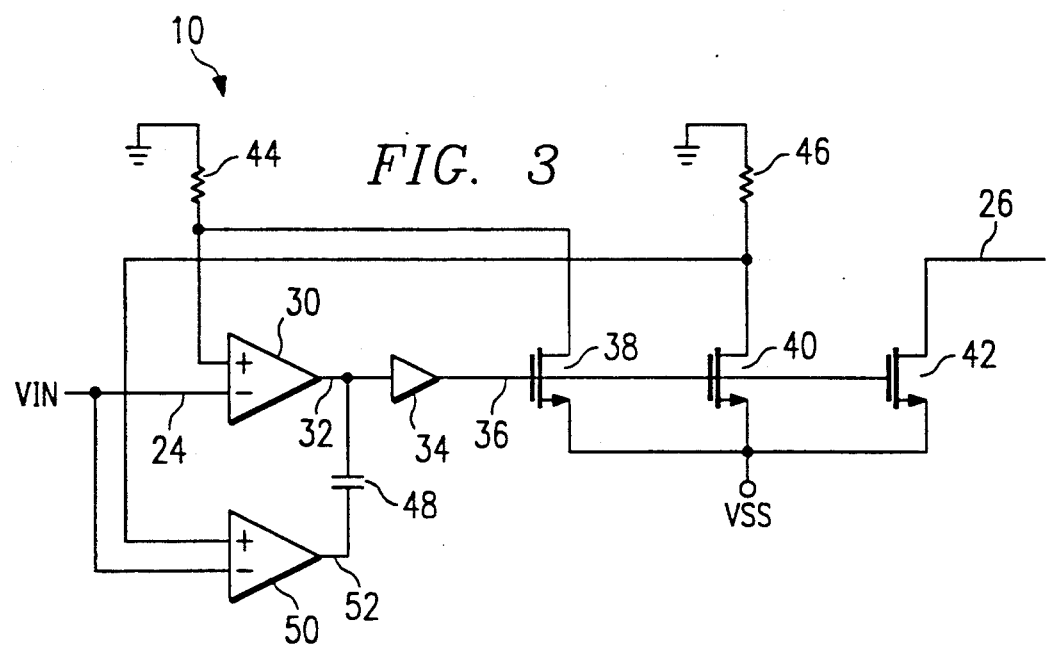
FIG. 3 is a preferred embodiment of a transconductance amplifier according to the present invention.

The amplifier 10 shown in FIG. 3 is the preferred embodiment of the present invention and differs from the circuit shown in FIG. 2 in that a second differential amplifier 50 has been added to the circuit. The minus input of the differential amplifier 50 is connected to the input signal VIN on line 24, and the positive input of the differential amplifier 50 is connected to the drain of transistor 40. The compensating capacitor 48 is connected between the output of the differential amplifier 50 and node 32. Thus the differential amplifier 50, along with the transistor 40 and resistor 46, forms an admittance driver circuit (also referred to as a capacitor driver circuit) in FIG. 3.

In operation if the gm of transistor 40 is proportional to the gm of transistor 38, and the resistance of resistor 46 is similarly proportional to the resistance of resistor 44, then the voltage at the drain of transistor 40 will be forced equal to VIN by the feedback to amplifier 30. The output of differential amplifier 50 will be constant since the voltage level at the positive and negative inputs of differential amplifier 50 will be equal. (Note that by superposition the voltage at the output of the differential amplifier 50 will vary linearly with the output current.) Therefore the voltage across the compensating capacitor 48 will change much less than the voltage across the compensating capacitor in FIG. 2. The drain of transistor 40 in FIG. 2 varies in an amount proportional to the input voltage on line 24. Therefore the current required to be driven by the differential amplifier 30 will be much less in the preferred embodiment resulting in a corresponding decrease in distortion in the differential amplifier 30. The compensation will be the same as long as the overall gain of the compensating capacitor driving circuit remains the same. I.e., the compensation will be the same as long as $gm_{40}$ times $R_{46}$ times $C_{48}$ of FIG. 2 is equal to $gm_{40}$ times $R_{46}$ times $C_{48}$ times $G_{50}$ of FIG. 3, where $G_{50}$ is the gain of amplifier 50.

However, another improvement can be made by adjusting the gm of transistor 40, the resistance of resistor 46, and the gain of the differential amplifier 50 in order to make the output of the differential amplifier 50 at node 52 track the voltage at the node 32 while maintaining the same overall combined gain.

Assuming that the gain of the buffer 34 is $\simeq 1$, and that the gain of differential amplifier 30 is $\gg 1$, then $$V_{52} = (V_{32}(-gm_{40} \cdot R_{46}) - V_{in})G_{50}$$

and $$V_{in} = -gm_{38} \cdot R_{44} \cdot V_{32}$$

then $$V_{52} = (V_{32}(-gm_{40} \cdot R_{46} + gm_{38} \cdot R_{44}))G_{50}$$

For $$V_{52} = V_{32}$$

then $$(-gm_{40} \cdot R_{46} + gm_{38} \cdot R_{44})G_{50} = 1$$

or $$G_{50} = \frac{1}{gm_{38} \cdot R_{44} - gm_{40} \cdot R_{46}}$$

Therefore if the gain of the differential amplifier 50 is set to the inverse of the difference between the gm of transistor 38 times the resistance of resistor 44 and the gm of transistor 40 times the resistance of resistor 46 then the voltage at node 52 will track the voltage at node 32.

In practice however there are additional parasitic capacitances on node 32, and if the gain, $G_{50}$, of differential amplifier 50 is slightly higher than calculated, the differential amplifier 50 will provide current for these stray capacitances through the compensation capacitor 48.

It will be appreciated that the buffer circuit 34 is used to isolate the capacitance on node 32 from the gate-to-source capacitances of transistors 38, 40, and 42. In certain applications in which these additional gate-to-source capacitances are not critical, the buffer 34 may be eliminated.

Figure 4A:
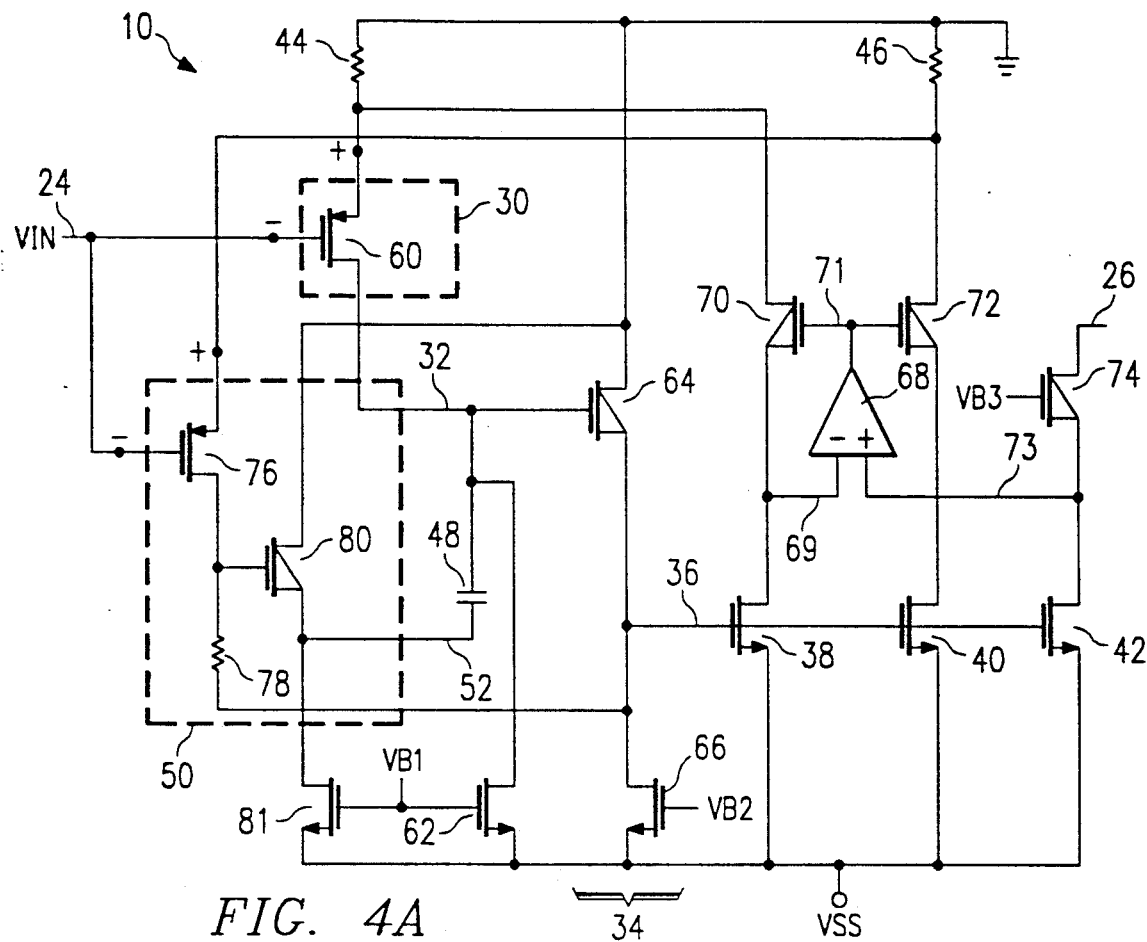
FIGS. 4A and 4B are a more detailed schematic of the preferred embodiment of a transconductance amplifier according to the present invention.
Figure 4B:
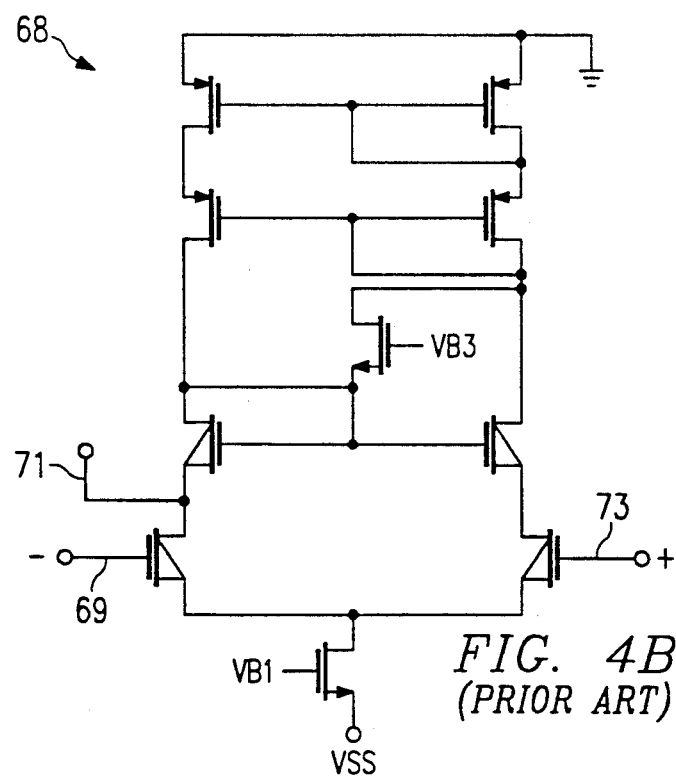

Turning now to FIGS. 4A and 4B, a more detailed schematic diagram of the preferred embodiment of FIG. 3 is shown. The amplifier 10 of FIG. 4A receives the input signal VIN on line 24 to a differential amplifier 30 which comprises a p-channel transistor 60 in which the source of the transistor forms the positive input of the differential amplifier 30 and the gate forms the negative input. The output of the differential amplifier 30 is the drain of the p-channel transistor 60 which is connected to one terminal of capacitor 48 and to the input of the buffer 34 and to the drain of an n-channel transistor 62, the source of which is connected to VSS, and the gate of which is connected to a reference voltage VB1. The buffer circuit 34 consists of two transistors 64 and 66. A first native transistor 64 has its gate connected to node 32, and its drain connected to ground. The source of transistor 64 is connected to node 36 and to the drain of an n-channel transistor 66 the source of which is connected to VSS, and the gate of which is connected to the second bias voltage VB2. Node 36 is connected to the gates of the n-channel transistors 38, 40, and 42 whose sources are connected to VSS.

The drain of transistor 38 is connected to the negative input of a differential amplifier 68 on a line 69 and to the source of native transistor 70. The drain of transistor 70 is connected to the node formed by one end of resistor 44 and the positive input of the differential amplifier 30. The other end of the resistor 44 is connected to ground. The gate of transistor 70 is connected to a node 71 which is connected to the output of the differential amplifier 68 and to the gate of another native transistor 72. The drain of the transistor 40 is connected to the source of the transistor 72, the drain of which is connected to a node formed by resistor 46 and the positive input of a differential amplifier 50. The other end of the resistor 46 is connected to ground. The drain of the transistor 42 is connected to the positive input of the differential amplifier 68 on a line 73 and also to the source of another native transistor 74 the drain of which forms the output terminal 26 of the amplifier 10. The gate of the transistor 74 is connected to a third bias voltage VB3.

The differential amplifier 50 has a p-channel input transistor 76 in which the source of transistor 76 forms the positive input of the differential amplifier 50 and the gate of the transistor 76 forms the negative input. The drain of the transistor 76 is connected to a resistor 78 and to the gate of a native transistor 80. The other end of the resistor 78 is connected to the node 36. The drain of the transistor 80 is connected to ground. The output of the differential amplifier 50 is the source of the transistor 80 which is connected to the drain of an n-channel transistor 81, the source of which is connected to VSS, and the gate of which is connected to VB1. This output drives one terminal of the capacitor 48, the other terminal of which is connected to the node 32. Although the bias generating circuitry is not shown in the drawings in order to avoid undue clutter, it will be understood that the bias voltage VB1, VB2, and VB3 can be generated by any of several means well known to those skilled in the art. In the preferred embodiment the circuitry shown in FIGS. 4A and 4B are formed on a single CMOS integrated circuit.

As shown in FIG. 4A the differential operation of the differential amplifiers 30 and 50 is performed by the source and gate terminals of transistors 60 and 76 respectively. Moreover the inverting gain of the differential amplifier 50 is affected by the ratio of the resistors 46 and 78, and the compensation feedback gain is primarily affected by the gm of the transistor 40 and the resistance of resistor 78.

Advantageously, the output reference node of differential amplifier 50 (the end of resistor 78 not connected to transistors 76 and 80) is connected to node 36. Thus as the voltage on node 36 changes, the output of the differential amplifier 50 (at node 52) also changes in a like manner. This connection helps to keep the voltage constant across the compensation capacitor 48 which reduces distortion.

It is also shown in FIG. 4A that the transistors 70, 72, and 74 are placed in a cascode arrangement. Since the output terminal 26 is DC connected to the inner conductor of a coax cable to which other driver circuits are also connected, the transistor 74 is used to help isolate transistor 42 and differential amplifier 68 from voltage changes which occur on the coax cable. Transistor 70 and 72 are used to match the cascode arrangement of transistor 74. The differential amplifier 68 operates to improve the matching between the output current path and the feedback current path, and to improve the output impedance characteristics of the amplifier 10. Since the gain of transistor 74 is finite and its output impedance is not a perfect current sink, amplifier 68 operates to compare the drain voltage of transistors 38 and 42 and to adjust the feedback paths containing transistors 38 and 40 in order to compensate for the variations in the drain voltage of transistor 42 during normal operation.

FIG. 4B is a schematic diagram of the differential amplifier 68. The differential amplifier shown in FIG. 4B is considered to be of standard design, and is included for completeness of the drawings.

Figure 5:
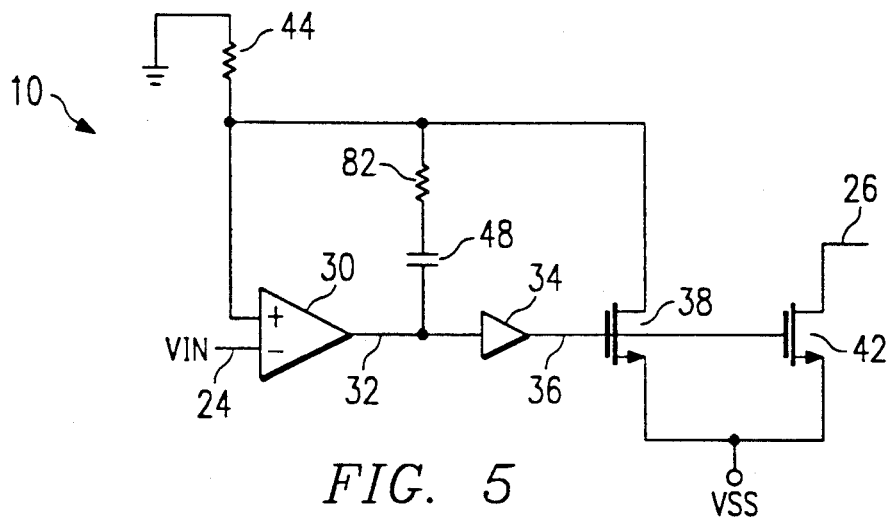
FIG. 5 is an alternative embodiment in which the circuit shown in FIG. 2 has been modified.

FIG. 5 is an alternative embodiment of the present invention in which the circuit shown in FIG. 2 has been modified. As shown in FIG. 5 the transistor 40 and resistor 46 are eliminated and the compensation capacitor 48 is connected between node 32 and the drain of transistor 38. The embodiment shown is FIG. 5 requires a differential amplifier 30 which has high enough input impedance to not affect the operation of the compensation capacitor 48. A resistor 82 is added in series with the compensation capacitor 48 to remove the right half plane zero caused by this compensation configuration. The resistor 82 and compensation capacitor 48 form the compensation admittance circuit of FIG. 5.

Figure 6:
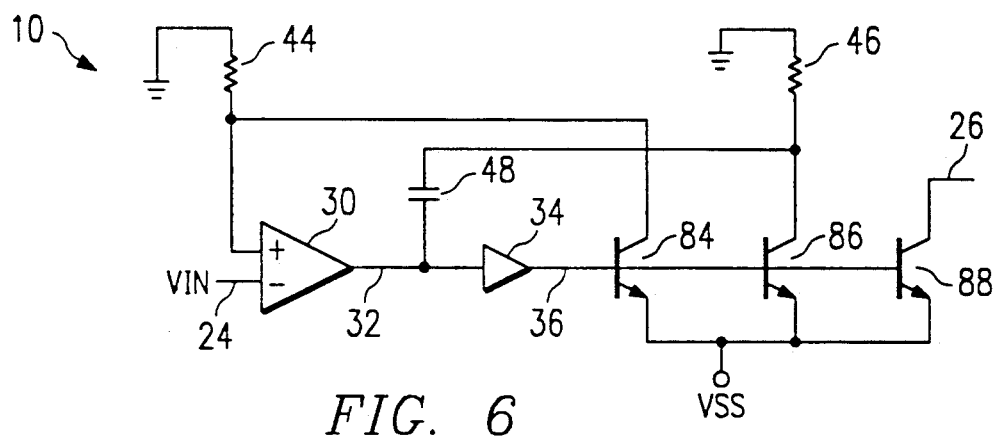
FIG. 6 is another alternative embodiment of a transconductance amplifier according to the present invention.

While the preferred embodiment of the invention uses MOS transistors, the present invention is also applicable to amplifiers using bipolar transistors. For example a bipolar amplifier according to the present invention is shown in FIG. 6. In FIG. 6 the MOS transistors 38, 40, and 42 of FIG. 2 have been replaced with bipolar transistors 84, 86, and 88 respectively. It will be understood that the other active devices in the circuit of FIG. 6 used in the differential amplifier 30 and the buffer circuit 34 could also be bipolar transistors.

Thus far all the embodiments of the invention have sensed the output current in the drain of an alternative transistor matched to the output device. To generalize the compensation scheme the feedback current can be sensed in either the source or the drain of the feedback transistor (transistor 38), the output transistor (transistor 42), or an alternative transistor (transistor 40). The only requirement is that the signal for the input of the compensation circuit have characteristics that vary proportionally to the characteristics in the amplifier's feedback loop that are being compensated for. The proper polarity amplification can condition this compensation signal and feed it back through a capacitance or generalized admittance to compensate the amplifier.

Figure 7:
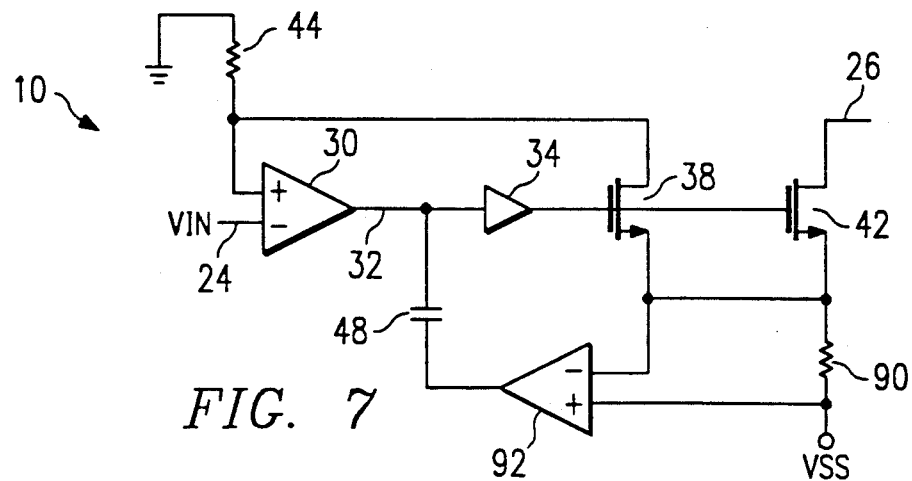
FIG. 7 is another alternative embodiment of a transconductance amplifier according to the present invention.

Therefore, in another alternative embodiment the second matching feedback path of transistor 40 and resistor 46 shown in FIG. 2 have been replaced in FIG. 7 by a current sensing resistor 90 placed between the source of transistors 42 and 38 and VSS. A differential amplifier 92 senses the voltage across the resistor 90 and conditions this voltage before applying it to one end of the compensating capacitor 48, the other end of which is connected to the node 32. The output and feedback currents are sensed directly in the sources of the output and feedback transistors to compensate the amplifier for changes in gm in these transistors.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein. For example the present invention can also be used with inverting and noninverting amplifiers, and with amplifiers which are current amplifiers.

What is claimed is:

1. A feedback amplifier for receiving an input signal at an input terminal and providing an output current proportional to said input signal, said amplifier comprising:
   a) an input stage coupled to said input terminal and providing an intermediate signal;
   b) an output stage coupled to said intermediate signal and providing said output current;
   c) a compensation admittance circuit having one terminal coupled to a first node in said input stage which signal at said node varies in response to said input signal, where the loading at said first node caused by said compensation admittance circuit reduces the bandwidth of said amplifier; and
   d) an admittance driver circuit having an output coupled to a second terminal of said compensation admittance circuit and having an input coupled to a second node in said amplifier such that said second terminal voltage varies linearly with said output current.

2. The amplifier as set forth in claim 1 wherein said compensation admittance circuit is a capacitor and said admittance driving circuit is a capacitor driver circuit.

3. The amplifier as set forth in claim 1 wherein said admittance driver circuit has a second input coupled to said input terminal.

4. The amplifier as set forth in claim 1 wherein said input signal is a voltage input signal.

5. The amplifier as set forth in claim 1 wherein the signal at said second node is derived from said output current.

6. The amplifier as set forth in claim 1 wherein said second node is in a third stage of said amplifier, said third stage being coupled to said intermediate signals, said signal at said second node being proportional to said output current signal.

7. The amplifier as set forth in claim 1 wherein said input of said admittance driver circuit is a voltage derived from the voltage differential across a resistive element placed in a series path with said output current.

8. The amplifier set forth in claim 1 wherein said bandwidth is dependent on the gm of at least one active device in said amplifier.

9. The amplifier set forth in claim 8 wherein the said at least one active device is an MOS transistor.

10. The amplifier set forth in claim 8 wherein the said at least one active device is a bipolar transistor.

11. The amplifier set forth in claim 1 wherein said output stage comprises a common source amplifier.

12. The amplifier set forth in claim 1 wherein said output stage comprises a common emitter amplifier.

13. An MOS current driver circuit comprising:
   a) a first differential amplifier having a first input for receiving an input signal;
   b) a feedback transistor having its gate coupled to an output of said first differential amplifier, its source coupled to a first reference potential, and its drain current coupled to a second input of said first differential amplifier and to one end of a first resistive element, the other end of which is coupled to a second reference potential, said first differential amplifier, said feedback transistor and said resistive element being operable to cause the signal level at said second input of said first differential amplifier to change in the same direction as a change at said first input of said first differential amplifier;
   c) an output transistor for providing an output current at the drain of said output transistor, the gate of said output transistor coupled to the gate of said first feedback transistor; and
   d) a compensation transistor having its gate coupled to said output of said differential amplifier, its source coupled to said first reference potential, and its drain coupled to one end of a second resistive element, the other end of which is coupled to said second reference potential, its drain also coupled to one end of a compensation admittance circuit, the other end of said compensation admittance circuit coupled to said output of said differential amplifier.

14. An MOS driver circuit as set forth in claim 13 further including a buffer circuit interposed between a first node and a second node, said first node formed by the connection of said compensation admittance circuit and the output of said differential amplifier, and said second node formed by the common connection of the gates of said feedback transistor and said compensation transistor, the input of said buffer circuit coupled to said first node, and the output of said buffer circuit coupled to said second node.

15. A method for compensating a feedback amplifier which receives an input signal at an input terminal and which provides an output current proportional to said input signal, said compensation method comprising the steps of:
a) loading a first node of said amplifier by coupling said first node to a first terminal of an admittance circuit wherein the bandwidth of said amplifier is reduced by the admittance loading at said first node;
b) generating a compensation signal which varies linearly with said output current; and
c) applying said compensation signal to a second terminal of said admittance circuit to thereby provide bandwidth compensation to said amplifier.

16. The method for compensating a feedback amplifier set forth in claim 15 further including the steps of
a) generating an input derived signal which is derived from the signal at said input terminal;
b) combining said compensation signal with said input derived signal; and
c) applying said combination of said compensation signal and said input derived signal to said second terminal of said admittance circuit.

17. The method for compensating a feedback amplifier set forth in claim 15 wherein the step of generating a compensation signal which varies linearly with said output current is accomplished by deriving said compensation signal from a second node in said amplifier, the signal at said second node being proportional to said output current.

18. The method for compensating a feedback amplifier set forth in claim 15 wherein the step of generating a compensation signal which varies linearly with said output current is accomplished by deriving said compensation signal from said output current.

19. The method for compensating a feedback amplifier set forth in claim 18 wherein the step of generating a compensation signal which varies linearly with said output current is accomplished by generating a voltage derived from the voltage differential across a resistive element placed in a series path with said output current.

* * * * *